(12) United States Patent
Li et al.

(10) Patent No.: US 10,692,436 B2
(45) Date of Patent: Jun. 23, 2020

(54) DISPLAY PANEL AND DISPLAY DEVICE

(71) Applicant: WUHAN TIANMA MICRO-ELECTRONICS CO., LTD., Wuhan (CN)

(72) Inventors: Yue Li, Wuhan (CN); Xingyao Zhou, Wuhan (CN); Yana Gao, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/249,904

(22) Filed: Jan. 17, 2019

(65) Prior Publication Data

US 2019/0147802 A1 May 16, 2019

(30) Foreign Application Priority Data

Sep. 30, 2018 (CN) .......................... 2018 1 1159710

(51) Int. Cl.
*G09G 3/3258* (2016.01)
*H01L 27/32* (2006.01)
(Continued)

(52) U.S. Cl.
CPC ............. *G09G 3/3258* (2013.01); *G09G 3/14* (2013.01); *G09G 3/2003* (2013.01); *G09G 5/14* (2013.01);
(Continued)

(58) Field of Classification Search
CPC ...... G09G 3/3258; G09G 3/14; G09G 3/2003; G09G 5/14; G09G 2320/0646;
(Continued)

(56) References Cited

U.S. PATENT DOCUMENTS

2002/0054036 A1* 5/2002 Johnson ................... G09G 3/20
345/204
2014/0285535 A1* 9/2014 Pyo ...................... G09G 3/3291
345/690

(Continued)

FOREIGN PATENT DOCUMENTS

CN 1811865 A * 8/2006
CN 1811865 A 8/2006
(Continued)

OTHER PUBLICATIONS

RaspberryPi (https://www.raspberrypi.org/forums/viewtopic.php?t=157216, entry by scotty101 dated Aug. 15, 2016 2:48pm) (Year: 2016).*

(Continued)

*Primary Examiner* — Mark Edwards
(74) *Attorney, Agent, or Firm* — Kilpatrick Townsend & Stockton, LLP

(57) ABSTRACT

The present disclosure provides a display panel and a display device. The display panel has a display area and an information notification area. The display panel includes: a first organic light-emitting device arranged in the display area; a pixel driving circuit arranged in the display area, and the pixel driving circuit is configured to receive a first power voltage; and at least one second organic light-emitting device arranged in the information notification area. Each of the at least one second organic light-emitting device is electrically connected to a control circuit, and the control circuit is configured to receive a second power voltage. The second power voltage is less than the first power voltage.

20 Claims, 4 Drawing Sheets

(51) Int. Cl.
  *G09G 3/20* (2006.01)
  *G09G 5/14* (2006.01)
  *G09G 3/14* (2006.01)

(52) U.S. Cl.
  CPC ...... *H01L 27/3202* (2013.01); *H01L 27/3211* (2013.01); *G09G 2320/0646* (2013.01); *G09G 2320/0666* (2013.01); *G09G 2330/021* (2013.01)

(58) Field of Classification Search
  CPC ...... G09G 2320/0666; G09G 2330/021; H01L 27/3202; H01L 27/3211
  See application file for complete search history.

(56) References Cited

U.S. PATENT DOCUMENTS

| | | | | |
|---|---|---|---|---|
| 2017/0238401 A1* | 8/2017 | Sadwick | ............... | F21K 9/235 315/294 |
| 2019/0229169 A1* | 7/2019 | Huang | ............... | H01L 21/77 |
| 2019/0293976 A1* | 9/2019 | Cheng | ............... | G02F 1/1336 |
| 2019/0331974 A1* | 10/2019 | Furuta | ............... | G09G 3/20 |

FOREIGN PATENT DOCUMENTS

| | | |
|---|---|---|
| CN | 105050252 A | 11/2015 |
| CN | 105679199 A | 6/2016 |

OTHER PUBLICATIONS

Cholewiak (Steven A. Cholewiak, pic16f628-4-rgb-led-schematic, 2009, downloaded from http://www.semifluid.com/2009/01/06/pic16f628-4-rgb-led-pwm-controller/ on Feb. 4, 2020) (Year: 2009).*

Guo (Guo et al., "The fabrication of color-tunable organic light-emitting diode displays via solution processing", Light: Science & Applications (2017) 6, e17094; doi:10.1038/lsa.2017.94; published online Nov. 17, 2017, retrieved from web Feb. 4, 2020) (Year: 2017).*

Office Action of Chinese Patent Application No. 201811159710.3 dated Nov. 29, 2019.

* cited by examiner

DISPLAY PANEL AND DISPLAY DEVICE

CROSS-REFERENCE TO RELATED APPLICATIONS

The present application claims priority to Chinese Patent Application No. 201811159710.3, filed on Sep. 30, 2018, the content of which is incorporated herein by reference in its entirety.

FIELD

The present disclosure relates to the field of display technologies, and in particular, to a display panel and a display device.

BACKGROUND

In a display device such as a cellphone or a tablet computer, an indicator light for reminding the use or work state of the device is usually provided. Currently, when the indicator light is provided in the display panel, the indicator light is usually disposed within a region outside a display area for displaying an image, and an LED light is additionally arranged in this region for use as an indicator light. In such a manner, not only the manufacturing process of the display panel is increased, but also the power consumption of the display panel during operation is high.

SUMMARY

In view of this, the present disclosure provides a display panel and a display device, aiming to simplify: the manufacturing process of the display panel and reduce the power consumption of the display panel during operation.

In one embodiment, the present disclosure provides a display panel. The display panel has a display area and an information notification area. The display panel includes: a first organic light-emitting device arranged in the display area; a pixel driving circuit arranged in the display area, and the pixel driving circuit is configured to receive a first power voltage; and at least one second organic light-emitting device arranged in the information notification area. Each of the at least one second organic light-emitting device is electrically connected to a control circuit, and the control circuit is configured to receive a second power voltage. The second power voltage is less than the first power voltage.

In another embodiment, the present disclosure provides a display control method for a display panel. The display panel has a display area and an information notification area. The display area includes a first organic light-emitting device, a pixel driving circuit and at least one second organic light-emitting device. The first organic light-emitting device and the pixel driving circuit are arranged in the display area, the at least one second organic light-emitting device is arranged in the information notification area, and each of the at least one second organic light-emitting device is electrically connected to a control circuit. The display control method includes: providing a first power voltage to the pixel driving circuit; and providing a second power voltage to the control circuit. The second power voltage is less than the first power voltage.

In still another embodiment, the present disclosure provides a display device, and the display device includes the display panel described above.

BRIEF DESCRIPTION OF DRAWINGS

Embodiments of the present disclosure, the drawings used in the embodiments will be described in the following. It should be noted that the drawings in the following description are some embodiments of the present disclosure.

DESCRIPTION OF EMBODIMENTS

Embodiments of the present disclosure will be described in detail as follows with reference to the accompanying drawings.

It should be rioted that, the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although a power voltage may be described using the terms of "first", "second", etc., in the embodiments of the present disclosure, the power voltage will not be limited to these terms. These terms are merely used to distinguish power voltages from one another. For example, without departing from the scope of the embodiments of the present disclosure, a first power voltage may also be referred to as a second power voltage, and similarly, a second power voltage may also be referred to as a first power voltage.

Figure 1:
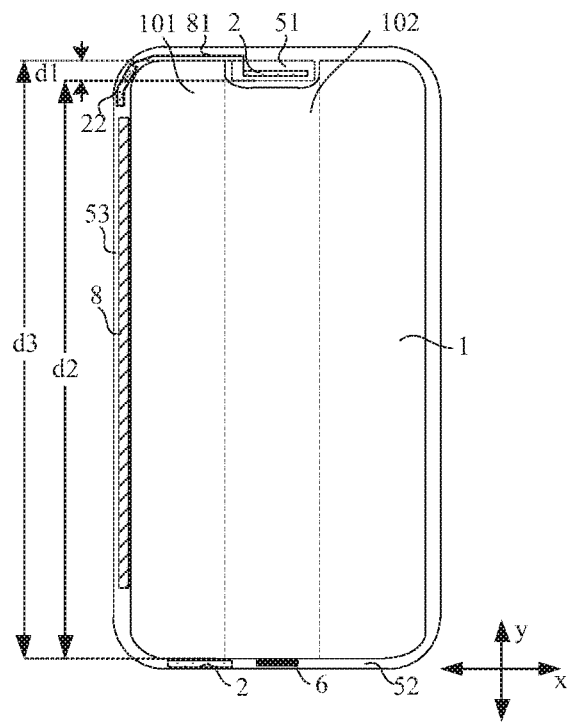
FIG. 1 is a schematic diagram of a display panel according to an embodiment of the present disclosure.
Figure 2:
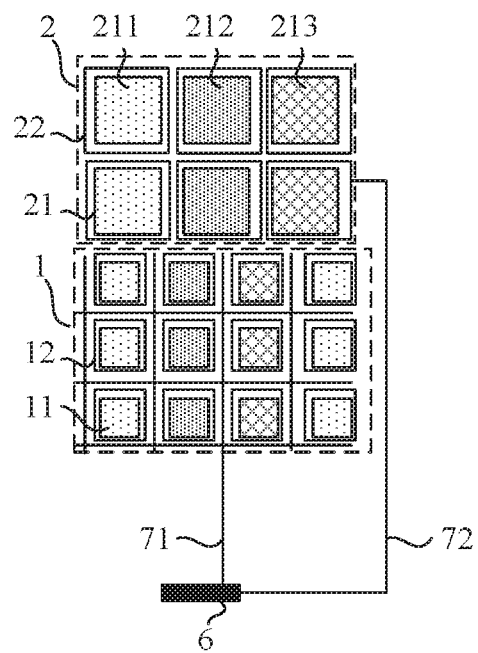
FIG. 2 is an enlarged schematic view showing a portion of a display area and an information notification area of FIG. 1.
Figure 3:
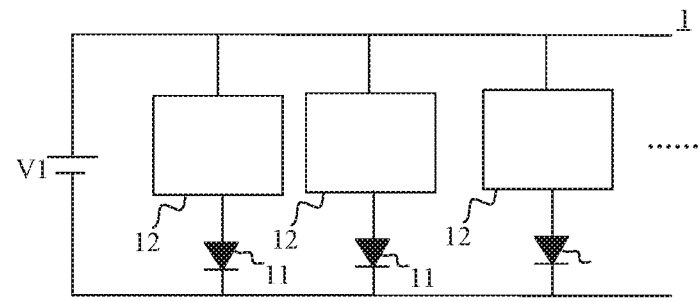
FIG. 3 is an equivalent circuit diagram of a first organic light-emitting device located in the display area during operation.
Figure 4:
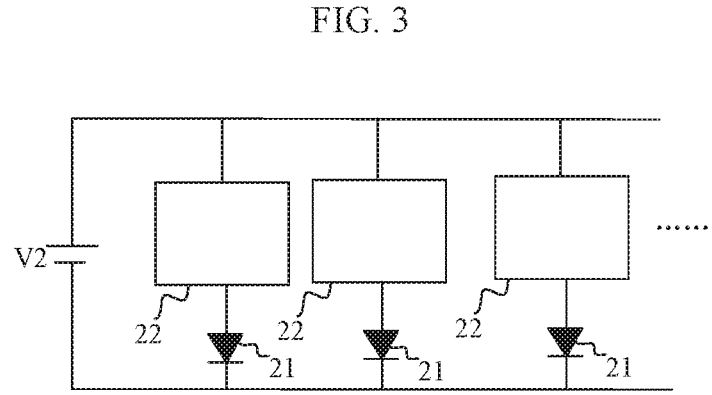
FIG. 4 is an equivalent circuit diagram of a second organic light-emitting device located in the information notification area during operation.

An embodiment of the present disclosure provides a display panel, as shown in FIG. 1, which is a schematic diagram of a display panel according to an embodiment of the present disclosure. The display panel has a display area 1 and an information notification area 2. FIG. 2 is an enlarged schematic view showing a portion of a display area and an information notification area of FIG. 1, FIG. 3 is an equivalent circuit diagram of a first organic light-emitting device located in the display area during operation, and FIG. 4 is an equivalent circuit diagram of a second organic light-emitting device located in the information notification area during operation. As shown in FIGS. 2-4, the display area 1 is provided with a first organic light-emitting device 11 and a pixel driving circuit 12 therein, and the pixel driving circuit 12 is configured to receive a first power voltage V1. The information notification area 2 is provided with a second organic light-emitting device 21 therein electrically connected to a control circuit 22, and the control circuit 22 is configured to receive a second power voltage V2. The second power voltage V2 is less than the first power voltage V1.

When the display panel is in operation, the pixel driving circuit 12 receives the first power voltage V1 and drives the first organic light-emitting device 11 to emit light. The control circuit 22 receives the second power voltage V2, and the second organic light-emitting device 21 emits light under control of the second power voltage V2 and the control circuit 22.

The display panel provided by this embodiment of the present disclosure has a display area 1 and an information notification area 2. When the display panel is in operation, the first organic light-emitting device 11 located in the display area 1 emits light in such a manner that the display panel can display images, and the second organic light-emitting device 21 located in the information notification area 2 emits light so as to remind the user the current working state of the display device formed by the display panel, for example, to remind whether the display device is being charged or whether there are items such as missed calls or unread messages. This can enrich the use of the display panel and meet the diverse needs of users.

Moreover, in this embodiment of the present disclosure, the first organic light-emitting device 11 is disposed within the display area 1, and the second organic light-emitting device 21 is disposed within the information notification area 2, so that a same process can be used when manufacturing the display panel so as to simultaneously form the first organic light-emitting device 11 in the display area and the second organic light-emitting device 21 in the information notification area 2. This can avoid additionally setting an LED light in the information notification area 2, thereby simplifying the manufacturing process.

In addition, according to this embodiment of the present disclosure, the second power voltage V2 for being supplied to the second organic light-emitting device 21 has a smaller value than the first power voltage V1 for being supplied to the first organic light-emitting device 11. In this way, while achieving the reminder function of the information notification area 2, the power consumption of the information notification area 2 can be reduced, and thus the overall power consumption of the display panel can be reduced.

Figure 5:
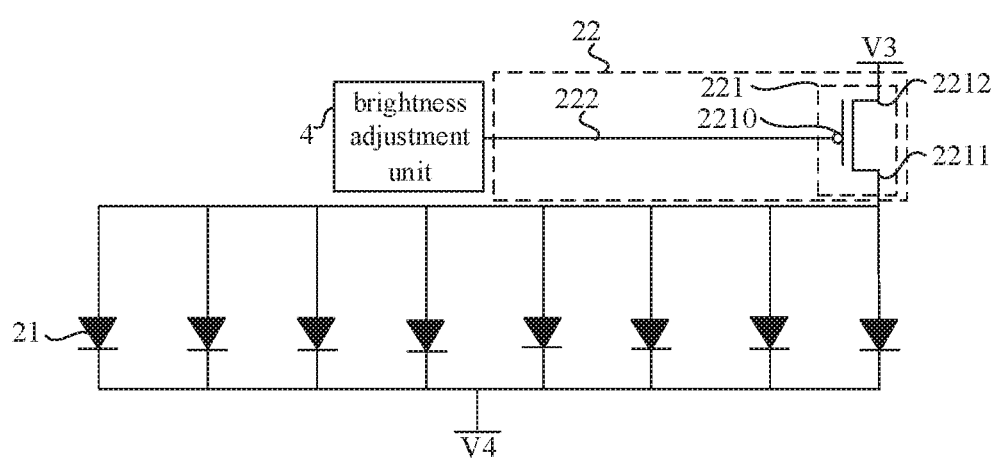
FIG. 5 is another equivalent circuit diagram of the second organic light-emitting device located in the information notification area during operation.

FIG. 5 is another equivalent circuit diagram of the second organic light-emitting device located in the information notification area during operation. As shown in FIG. 5, the control circuit 22 includes a switch element 221 and a switch control signal line 222. The switch element 221 has a control terminal 2210 connected to the switch control signal line 222, a first terminal 2211 connected to an anode of the second organic light-emitting device 21, and a second terminal 2212 configured to receive a third power voltage V3.

A cathode of the light-emitting device 21 is configured for receive a fourth power voltage V4. A voltage difference between the third power voltage V3 and the fourth power voltage V4 forms the second power voltage V2, that is, V3−V4=V2. When display is performed in the display notification area 2 for reminding the user, the switch element 221 is switched on under control of a signal provided by the switch control signal line 222, so that the voltages of the third power voltage V3 and the fourth power voltage V4 are transmitted to the anode and the cathode of the second organic light-emitting device 21. In such a way, electrons and holes are injected from the cathode and the anode to a light-emitting layer located therebetween, respectively, and electrons and holes meet in the light-emitting layer to form excitons. Then, the excitons excite light-emitting molecules in the light-emitting layer, and then the excited light-emitting molecules emit visible light through radiation relaxation, which can be observed by the observer, thereby achieving a reminder of the user.

Figure 6:
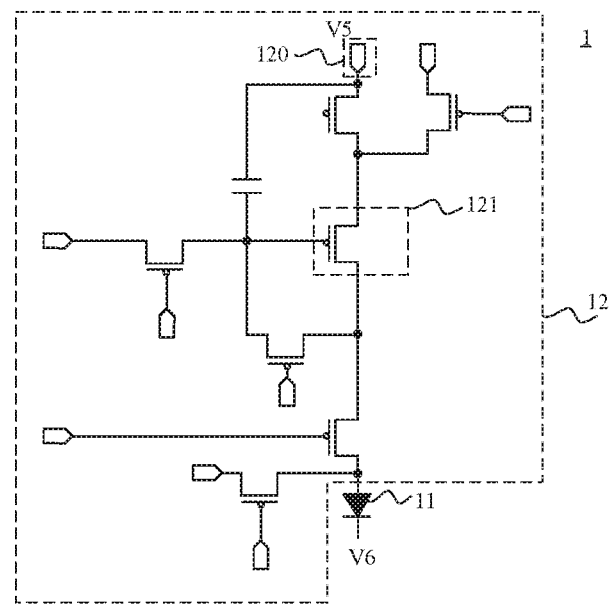
FIG. 6 is a schematic diagram of a pixel driving circuit according to an embodiment of the present disclosure.

FIG. 6 is a schematic diagram of a pixel driving circuit according to an embodiment of the present disclosure. In an example, as shown in FIG. 6, the pixel driving circuit 12 includes a driving transistor 121 and a power signal input terminal 120. The first organic light-emitting device 11 has a anode electrically connected to the power signal input terminal 120 through the driving transistor 121, and the power signal input terminal 120 is configured to receive a fifth power voltage V5. The organic light-emitting device 11 further has a cathode configured to receive a sixth power voltage V6. A voltage difference between the fifth power voltage V5 and the sixth power voltage V6 forms the first power voltage V1, that is, V5−V6=V1. An absolute value of the third power voltage V3 is less than an absolute value of the fifth power voltage V5. An absolute value of the fourth power voltage V4 is less than an absolute value of the sixth power voltage V6. That is, |V3|<|V5| and |V4↑<|V6↑. In other words, in this embodiment of the present disclosure, the second power voltage V2 is set to be less than the first power voltage V1, the absolute value of the third power voltage V3 is set to be less than the absolute value of the fifth power voltage V5, and the absolute value of the fourth power voltage V4 is set to be less than the absolute value of the sixth power voltage V6, such that the power consumption of the information notification area 2 can be further reduced and thus the power consumption of the display panel can be reduced.

In an example, as shown in FIG. 5, a plurality of second organic light-emitting devices 21 is provided, and the plurality of second organic light-emitting devices 21 is connected to a same switch element 221. When adjusting the brightness of an image in the information notification area 2, the switch-on time of the switch element 221 can be adjusted by adjusting the duty ratio of the control signal on the switch control signal line 222, thereby adjusting the brightness of an image to be displayed in the information notification area 2.

Figure 7:
FIG. 7 is a waveform diagram of a control signal transmitted through a switch control signal line.

As shown in FIG. 5, the display panel further includes a brightness adjustment device 4, and the brightness adjustment device 4 is connected to the switch control signal line 222. When the display panel is in operation, the brightness adjustment device 4 outputs a control signal to the switch control signal line 222 according to information on the brightness of the image to be displayed in the information notification area 2, and the switch control signal line 222 uniformly adjusts the switch-on time of the switch element 221 according to a duty ratio of the control signal, so as to adjust the brightness of the image to be displayed in the information notification area 2. This can facilitate adjustment of the working state in the information notification area 2, thereby simplifying the operation. Moreover, in this embodiment of the present disclosure, a duty ratio adjustment manner is adopted. FIG. 7 is a waveform diagram of a control signal transmitted through a switch control signal line. As shown in FIG. 7, in an example, the switch element 221 is a P-type transistor, the switch element 221 is switched on at a low level, and the switch element 221 is switched off at a high level. The second organic light-emitting device 21 emits light when the switch element 221 is switched on, and the second organic light-emitting device 21 does not emit light when the switch element 221 is switched off. Since the switching frequency of the switch element 221 is high, the human eyes cannot feel the intermittent non-lighting phenomenon under control of the control signal. Based on this, in this embodiment of the present disclosure, the switch-on time of the switch element 221 is adjusted in such a manner that the emitting-light time of the second organic light-emitting device 21 becomes longer when the switch-on time becomes longer so that the brightness of the information notification area 2 observed by the human eye becomes larger, and that the emitting-light time of the second organic light-emitting device 21 becomes shorter when the switch-on time becomes shorter so that the brightness of the information notification area 2 observed by the human eye becomes smaller. In this way, the brightness of the image displayed in the information notification area 2 can be accurately and continuously controlled, so as to meet various display requirements. The abovementioned switch element 221 can also be an N-type transistor, and the brightness of the image displayed in the information notification area 2 can be adjusted by adjusting the control signal, which will not be limited in the embodiments of the present disclosure.

Figure 8:
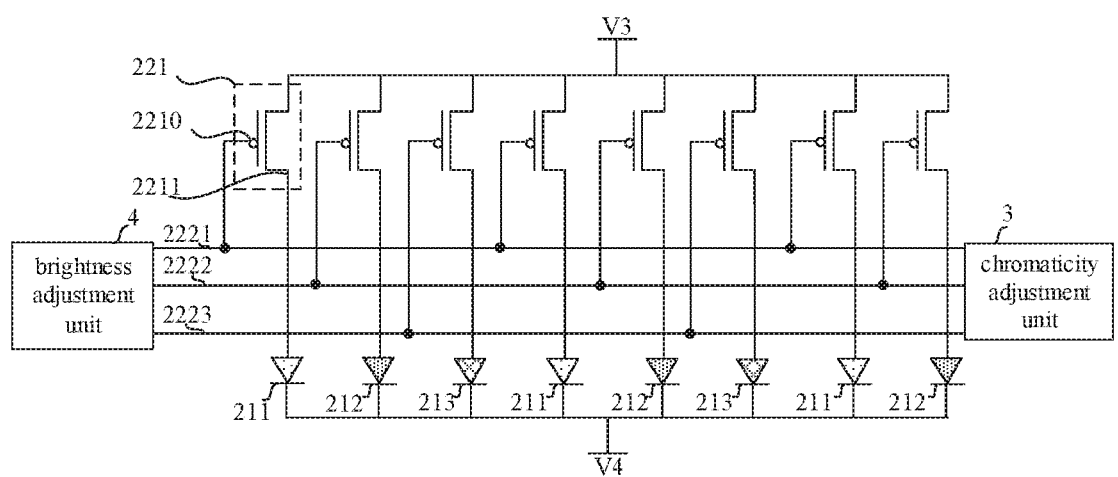
FIG. 8 is still another equivalent circuit diagram of the second organic light-emitting device located in the information notification area during operation.

In another embodiment of the present disclosure, the plurality of second organic light-emitting devices 21 can be individually controlled. FIG. 8 is still another equivalent circuit diagram of a second organic light-emitting device located in the information notification area during operation. As shown in FIG. 2 and FIG. 8, the plurality of second organic light-emitting devices 21 includes a first color organic light-emitting device 211, a second color organic light-emitting device 212, and a third color organic light-emitting device 213. The switch control signal lines 222 include a first color switch control signal line 2221, a second color switch control signal line 2222, and a third color switch control signal line 2223. Here, the control terminal of the switch element 221 connected to the first color organic light-emitting device 211 is connected to the first color switch control signal line 2221, the control terminal of the switch element 221 connected to the second color organic light-emitting device 212 is connected to the second color switch control signal line 2222, and the control terminal of the switch element 221 connected to the third color organic light-emitting device 213 is connected to the third color switch control signal line 2223. That is, in this embodiment of the present disclosure, the second organic light-emitting devices of different colors are individually controlled so as to adjust brightness of a single color of the displayed image, thereby achieving adjustment of chromaticity of the displayed image.

However, the demand of consumers for information reminder is not limited to brightness adjustment. For example, it is needed to distinguish family contact information from ordinary contact information, e.g., by indicating family contact using a red indicator light and indicating ordinary contact using a green indicator light. It may be also needed to distinguish among messages, WeChat and telephone, e.g., by using indicator lights having different colors. Therefore, the present disclosure provides a display panel in which the color and brightness of the indicator light can be adjusted.

As shown in FIG. 8, the display panel includes a chromaticity adjustment device 3 and a brightness adjustment device 4. The working principle of the brightness adjustment device 4 is the same as that of the embodiments shown in FIG. 5, and details thereof will not be further described herein. The chromaticity adjustment device 3 is connected to the switch control signal lines 222. Here, the chromaticity adjustment device 3 is individually connected to the first color switch control signal line 2221, the second color switch control signal line 2222, and the third color switch control signal line 2223. When the display panel is in operation, based on chromaticity information of an image to be displayed in the information notification area 2, the chromaticity adjustment device 3 outputs a first control signal to the first color switch control signal line 2221, outputs a second control signal to the second color switch control signal line 2222, and outputs a third control signal to the third color switch control signal line 2223. Then, the first color switch control signal line 2221 adjusts the switch-on time of the switch element 221 electrically connected to the first color switch control signal line 2221 according to the duty ratio of the first control signal, so as to achieve adjustment of the brightness of the first color organic light-emitting device 211 in the information notification area 2. Similarly, the second color switch control signal line 2222 adjusts the switch-on time of the switch element 221 electrically connected to the second color switch control signal line 2222 according to the duty ratio of the second control signal, so as to achieve adjustment of the brightness of the second color organic light-emitting device 212 in the information notification area 2. The third color switch control signal line 2223 adjusts the switch-on time of the switch element 221 electrically connected to the third color switch control signal line 2223 according to the duty ratio of the third control signal, so as to achieve adjustment of the brightness of the third color organic light-emitting device 213 in the information notification area 2. In this embodiment of the present disclosure, the chromaticity of the displayed image in the information notification area 2 can be adjusted by individually adjusting the brightness of the first color organic light-emitting device 211, the brightness of the second color organic light-emitting device 212 and the brightness of the third color organic light-emitting device 213.

In an example, the abovementioned first color organic light-emitting device 211 is a red organic light-emitting device, the second color organic light-emitting device 212 is a green organic light-emitting device, and the third color organic light-emitting device 213 is a blue organic light-emitting device. In this way, a variety of colors can be displayed by mixing the second organic light-emitting devices 21 of the three different colors in different brightness ratios.

Figure 9:
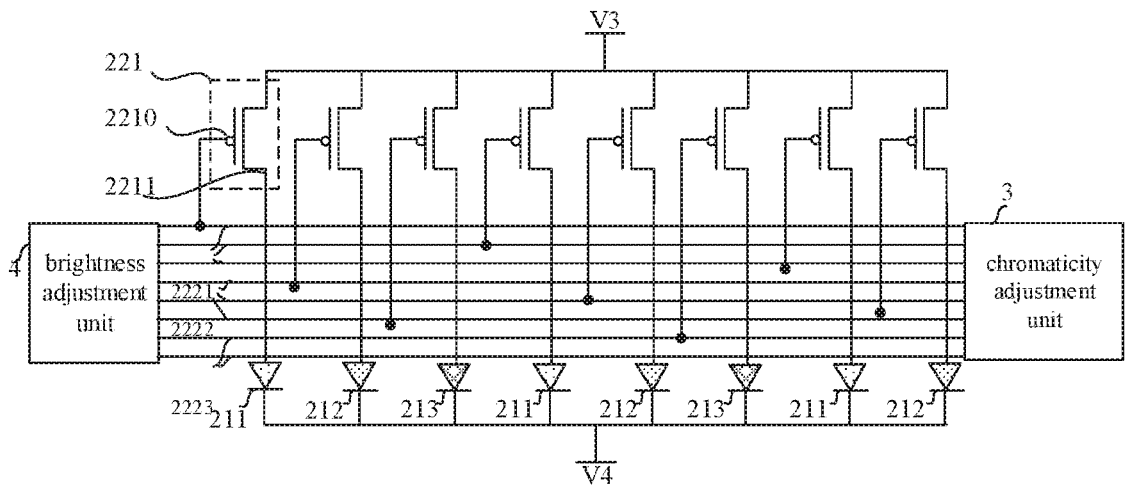
FIG. 9 is yet still another equivalent circuit diagram of the second organic light-emitting device located in the information notification area during operation.

FIG. 9 is yet still another equivalent circuit diagram of a second organic light-emitting device located in the information notification area during operation. In an example, as shown in FIG. 9, there are a plurality of first color switch control signal lines 2221 provided and a plurality of first color organic light-emitting devices 211 provided. The control terminals of the switch elements 221 connected to the plurality of first color organic light-emitting devices 211 are connected to the plurality of first color switch control signal lines 2221 in one-to-one correspondence. There are a plurality of second color switch control signal lines 2222 provided and a plurality of second color organic light-emitting devices 212 provided. The control terminals of the switch elements 221 connected to the plurality of second color organic light-emitting devices 212 are connected to the plurality of the second color switch control signal lines 2222 in one-to-one correspondence. There are a plurality of third color switch control signal lines 2223 provided and a plurality of third color organic light-emitting devices 213 provided. The control terminals of the switch elements 221 connected to the plurality of third color organic light-emitting devices 213 are connected to the plurality of third color switch control signal lines 2223 in one-to-one correspondence. That is, this embodiment of the present disclosure individually adjusts the respective brightness of the second organic light-emitting devices of different colors by connecting the respective control terminals of the switch elements connected to the second organic light-emitting devices of different colors to different switch control signal lines, and adjusts the brightness of a single color of the displayed image by individually controlling the second organic light-emitting devices of a same color, such that the adjustment accuracy of the color of the displayed image can be further improved and the display effect can be optimized.

As shown in FIG. 9, the display panel includes a chromaticity adjustment device 3 and a brightness adjustment device 4. The working principle of the brightness adjustment device 4 is the same as that of the embodiments shown in FIG. 4, and details thereof will not be further described herein. The chromaticity adjustment device 3 is individually connected to each first color switch control signal line 2221, each second color switch control signal line 2222, and each third color switch control signal line 2223. When the display panel is in operation, the chromaticity adjustment device 3 outputs control signals corresponding to different second organic light-emitting devices 21 to the respective switch control signal lines 221 according to the chromaticity information of the image to be displayed in the information notification area 2. Different switch control signal lines 222 connected to different second organic light-emitting devices 21 accordingly adjust the switch-on time of each switch element 221 according to the duty ratios of different control signals. By individually adjusting the colors displayed by the first color organic light-emitting device 211, the second color organic light-emitting device 212 and the third color organic light-emitting device 213, adjustment of the chromaticity of the image displayed in the information notification area 2 can be achieved, and thus accuracy of adjusting the chromaticity can be improved.

In an embodiment, the light-emitting layers of the above-mentioned organic light-emitting devices of different colors can be made of a plurality of different light-emitting materials. According to different choices of light-emitting materials, the second power voltage $V_R$, which causes the red organic light-emitting device to emit light, can be set to satisfy $4{,}090V \leq V_R \leq 4{.}600V$, the second power voltage $V_G$, which causes the green organic light-emitting device to emit light, can be set to satisfy $3{.}550V \leq N_G \leq 4{.}600V$, and the second power voltage $V_B$, which causes the blue organic light-emitting device to emit light, can be set to satisfy $3{.}725V \leq V_B \leq 4{,}600V$. In this way, when performing display in the information notification area 2, the red organic light-emitting device, the green organic light-emitting device and the blue organic light-emitting device can be individually supplied with power. For example, the red organic light-emitting device can be supplied with a second power voltage of 4.090V, the green organic light-emitting device can be supplied with a second power voltage of 3,550V, and the blue organic light-emitting device can be supplied with a second power voltage of 3,725V. If the second organic light-emitting devices of different colors are supplied with a same voltage, this voltage may be set in such a manner that the second organic light-emitting device of each color can emit light. For example, if the second organic light-emitting devices of different colors described above are supplied with a same voltage, this voltage needs to satisfy $V \geq 4.090V$, Compared with the case in which the green organic light-emitting device may require for a second power voltage of 3.550V and the blue organic light-emitting device may require for a second power voltage of 3.725V described above when the second organic light-emitting devices of different colors are individually powered, the power consumption of the information notification area is larger if the second organic light-emitting devices of different colors described above are supplied with a same voltage. Therefore, in this embodiment of the present disclosure, when selecting light-emitting materials for the second organic light-emitting devices of different colors, the light-emitting materials of different colors satisfy the above conditions, so that when performing display in the information notification area 2, the second organic light-emitting devices of different colors can be individually provided with a required power voltage, so as to further reduce the power consumption of the information notification area, thereby reducing the power consumption of the display panel.

In an example, as shown in FIG. 1, the display panel described above further has a first non-display area 51 and a second non-display area 52. In a first direction x, the display area 1 includes a first display area 101 and a second display area 102. In a second direction v, the first non-display area 51 and the second display area 102 are sequentially arranged, and a sum of a length d1 of the first non-display area 51 and a length d2 of the second display area 102 is equal to a length d3 of the first display area 101. The second non-display area 52 is located at a side of the second display area 102 facing away from the first non-display area 51. The second non-display area 102 is provided with a driving chip 6. In such a setting manner, a "notch zone", as shown by the first non-display area 51 in FIG. 1, can be formed on one side of the display panel. In this way, elements such as a handset, a camera and the like then can be placed at this position so as to increase an area of the display area 1 in the display panel, thereby increasing the screen occupancy ratio of the display panel.

In an example, as shown in FIG. 2, in this embodiment of the present disclosure, the pixel driving circuit 12 can be connected to the driving chip 6 through a first signal line 71. The switch control signal line (not shown) in the control circuit 22 is connected to the driving chip 6 through a second signal line 72. That is, the pixel driving circuit 12 and the control circuit 22 individually receive respective driving signals from the driving chip 6, so that the display area 1 and the information notification area 2 work individually without affecting each other. Generally, when performing display in the information notification area 2, the display area 1 is in a non-display state. That is, the information notification function is generally switched on when the display panel is in a screen-rest state. In this embodiment of the present disclosure, the operation of the information notification area 2 and the operation of the display area 1 are individually controlled by the driving chip 6. As described above, in conjunction with FIG. 3 and FIG. 4, the second power voltage V2 applied to the information notification area 2 is set to be less than the first power voltage V1 supplied to the display area 1. In this way, when the second power voltage V2 is supplied to the second organic light-emitting device 21 disposed in the information notification area 2, the first organic light-emitting device 11 located in the display area 1, which should not emit light, can be prevented from emitting light, that is, light emitting in the display area 1 can be avoided. Further, when performing display in the information notification area 2, since the first organic light-emitting device 11 in the display area 1 does not emit light, the power consumption of the display panel can be reduced.

In an embodiment, the information notification area 2 can be arranged at multiple positions in the display panel according to different requirements from the users. For example, as shown in FIG. 1, the information notification area 2 can be arranged in the first non-display area 51 or in the second non-display area 52, or the information notification area 2 can be arranged both in the first non-display area 51 and in the second non-display area 52. The specific position of the information notification area 2 is not limited in this embodiment of the present disclosure, as long as the information notification area 2 can be distinguished from the content displayed in display area 1.

In an example, the control circuit 22 and the second organic light-emitting device 21 may also be set to have various positions. For example, as shown in FIG. 2, both the control circuit 22 and the second organic light-emitting device 21 are arranged in the information notification area. Moreover, in this embodiment of the present disclosure, the second organic light-emitting device 22 overlaps with the switch element 221, so as to prevent the information notification area 2 from occupying an excessive area, thereby guaranteeing the area of the display area 1 and thus improving the screen occupancy ratio of the display panel.

In another embodiment, as shown in FIG. 1, the display panel described above further has a third non-display area 53 provided with a peripheral circuit 8. The third non-display area 53 is located at a side of the first display area 101 facing away from the second display area 102. The control circuit 22 can be disposed at any position in the third non-display area 53 that does not overlap the peripheral circuit 8. As described above, the information notification area 2 can be disposed in the first non-display area 51 and/or the second non-display area. That is, the second organic light-emitting device 21 can be disposed in the first non-display area 51 and/or the second non-display area 52. In this embodiment of the present disclosure, a connection line 81 may be further provided to connect a first terminal of a switch element (not shown) in the control circuit 22 located in the third non-display area 53 to an anode of the second organic light-emitting device (not shown) located in the information notification area 2.

In an example, as shown in FIG. 2, the second organic light-emitting device 21 has a larger area than that of the first organic light-emitting device 11, so as to reduce the number of the second organic light-emitting devices 21 arranged in the limited space of the information notification area 2, thereby further reducing the power consumption of the information notification area 2 and thus reducing the power consumption of the display panel.

In an embodiment of the present disclosure, a display control method for a display panel is further provided. The structure of the display panel has been described, and details thereof will not be further described herein. The display control method includes following steps.

At Step S1, a first power voltage is provided to the pixel driving circuit,

At Step S2, a second power voltage is provided to the control circuit.

Herein, the second power voltage is less than the first power voltage.

It should be noted that, in this embodiment of the present disclosure, the sequence of step S1 and step S2 is not limited. That is, it is possible to perform step S1 first and then step S2, or to perform step S2 first and then step S1, or to perform step S1 and step S2 at the same time. The embodiments of the present disclosure make no limitations herein.

With the display control method provided by this embodiment of the present disclosure, the second power voltage supplied to the second organic light-emitting device is set to be less than the first power voltage supplied to the first organic light-emitting device, so that the power consumption of the information notification area can be reduced while achieving the reminder function of the information notification area, thereby reducing the power consumption of the overall display panel.

In an example, the method further includes steps following the second power voltage V2 being applied to the control circuit 22.

At Step S3, a first control signal is output to the first color switch control signal line 2221 according to the chrominance information of the image to be displayed in the information notification area 2, and the switch-on time of the switch element 221 connected to the first color organic light-emitting device 211 is adjusted according to the duty ratio of the first control signal.

At Step S4, a second control signal is output to the second color switch control signal line 2222 according to the chrominance information of the image to be displayed in the information notification area 2, and the switch-on time of the switch element connected to the second color organic light-emitting device 212 is adjusted according to the duty ratio of the second control signal.

At Step S5, a third control signal is output to the third color switch control signal line 2223 according to the chrominance information of the image to be displayed in the information notification area 2, and the switch-on time of switch element 221 connected to the third color organic light-emitting device 213 is adjusted according to the duty ratio of the third control signal.

It should be understood that the sequence of step S3, step S4 and step S5 is not limited herein. That is, it is possible to perform step S3 first and then step S4 and step S5, or to perform step S3 first and then step S5 and step S4, or to perform step S5 first and then step S3 and step S4, or to perform step S3, step S4 and step S5 at the same time. The embodiments of the present disclosure do not make limitations herein. In this embodiment of the present disclosure, the second organic light-emitting devices of different colors are individually controlled to adjust the brightness of a single color of the displayed image, thereby achieving adjustment of the chromaticity of the displayed image.

In an embodiment, the method may further include the following step following the second power voltage V2 being provided to the control circuit 22.

At Step S7, a control signal is output to the switch control signal line according to the brightness information of the image to be displayed in the information notification area 2, and the switch-on time of the switch element 221 is adjusted according to the duty ratio of the control signal. In this embodiment of the present disclosure, the control of a voltage average value of the voltage signals applied to the second organic light-emitting device 21 is achieved by adjusting the duty ratio, i.e., by controlling a ratio between the switch-on time and the switched-off time of the switch element 221. In this way, the present disclosure can achieve accurate and continuous control of the brightness of the displayed image in the information notification area 2, thereby facilitating meeting different display requirements.

Figure 10:
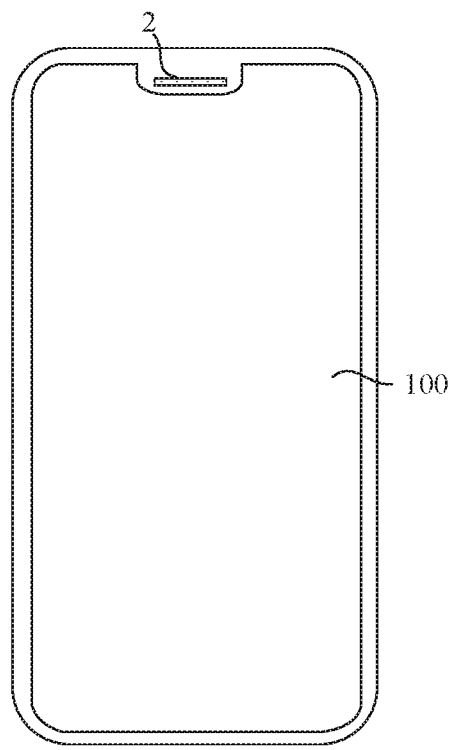
FIG. 10 is a schematic diagram of a display device according to an embodiment of the present disclosure.

In an embodiment of the present disclosure, a display device is further provided. FIG. 10 is a schematic diagram of a display device according to an embodiment of the present disclosure. As shown in FIG. 10, the display device includes the display panel 100 described above, and the display panel 100 has an information notification area 2. The structure of the display panel 100 has been described in the above embodiments, and details thereof will not be further described herein. It should be noted that the display device shown in FIG. 10 is merely illustrative, and the display device can be any electronic device having a display function, such as a cellphone, a tablet computer, a notebook computer, an electronic paper book, or a television.

The display device provided by this embodiment of the present disclosure has a display area and an information notification area. When the display panel is in operation, the first organic light-emitting device located in the display area emits light so as to allow the display panel to display an image, and the second organic light-emitting device located in the information notification area emits light so as to remind the user the current working state of the display device formed by the display panel, for example, to remind whether the display device is being charged or whether there are items such as missed calls or unread messages. This can enrich the use of the display panel and meet the diverse needs of users.

Moreover, in this embodiment of the present disclosure, the first organic light-emitting device is disposed within the display area, and the second organic light-emitting device is disposed within the information notification area, so that a same process can be used when manufacturing the display panel so as to simultaneously form the first organic light-emitting device in the display area and the second organic light-emitting device in the information notification area. This can avoid additionally setting an LED light in the information notification area, thereby simplifying the manufacturing process.

In addition, according to this embodiment of the present disclosure, the second power voltage for being supplied to the second organic light-emitting device has a smaller value than the first power voltage for being supplied to the first organic light-emitting device. In this way, while achieving the reminder function of the information notification area, the power consumption of the information notification area can be reduced, and thus the overall power consumption of the display panel can be reduced.

What is claimed is:

1. A display panel, wherein the display panel has a display area and an information notification area, the display panel comprises:
   a first organic light-emitting device arranged in the display area;
   a pixel driving circuit arranged in the display area, wherein the pixel driving circuit is configured to receive a first power voltage; and
   at least one second organic light-emitting device arranged in the information notification area, wherein each of the at least one second organic light-emitting device is electrically connected to a control circuit, and the control circuit is configured to receive a second power voltage,
   wherein the second power voltage is less than the first power voltage;
   wherein the pixel driving circuit is different from the control circuit; and
   wherein the control circuit comprises at least one switch element and at least one switch control signal line which provides a switch control signal, wherein the at least one switch control signal line adjusts switch-on time of one of the at least one switch element according to a duty ratio of the switch control signal, and each of the at least one switch element has a control terminal directly connected to one of the at least one switch control signal line.

2. The display panel according to claim 1, wherein
   each of the at least one switch element further comprises a first terminal connected to an anode of a respective one of the at least one second organic light-emitting device, and a second terminal configured to receive a third power voltage,
   each of the at least one second organic light-emitting device has a cathode configured to receive a fourth power voltage, and
   the second power voltage is formed by a voltage difference between the third power voltage and the fourth power voltage.

3. The display panel according to claim 2, wherein the pixel driving circuit comprises a driving transistor and a power signal input terminal, the first organic light-emitting device has an anode electrically connected to the power signal input terminal through the driving transistor, and the power signal input terminal is configured to receive a fifth power voltage; the first organic light-emitting device further has a cathode configured to receive a sixth power voltage; and the first power voltage is formed by a voltage difference between the fifth power voltage and the sixth power voltage,
   the third power voltage has an absolute value less than an absolute value of the fifth power voltage, and
   the fourth power voltage has an absolute value less than an absolute value of the sixth power voltage.

4. The display panel according to claim 2, wherein the at least one second organic light-emitting device comprises a plurality of second organic light-emitting devices, and the plurality of second organic light-emitting devices is electrically connected to one of the at least one switch element.

5. The display panel according to claim 2, wherein the at least one second organic light-emitting device comprises at least one first color organic light-emitting device, at least one second color organic light-emitting device and at least one third color organic light-emitting device,
   the at least one switch control signal line comprises at least one first color switch control signal line, at least one second color switch control signal line and at least one third color switch control signal line,
   the control terminal of each of the at least one switch element connected to one or more of the at least one first color organic light-emitting device is connected to one of the at least one first color switch control signal line;
   the control terminal of each of the at least one switch element connected to one or more of the at least one second color organic light-emitting device is connected to one of the at least one second color switch control signal line; and the control terminal of each of the at least one switch element connected to one or more of the at least one third color organic light-emitting device is connected to one of the at least one third color switch control signal line.

6. The display panel according to claim 5, wherein the at least one first color switch control signal line comprises a plurality of first color switch control signal lines, the at least one first color organic light-emitting device comprises a plurality of first color organic light-emitting devices, and the control terminals of the at least one switch element connected to the plurality of first color organic light-emitting devices are connected to the plurality of first color switch control signal lines in one-to-one correspondence;

the at least one second color switch control signal line comprises a plurality of second color switch control signal lines, the at least one second color organic light-emitting device comprises a plurality of second color organic light-emitting devices, and the control terminals of the at least one switch element connected to the plurality of second color organic light-emitting devices are connected to the plurality of second color switch control signal lines in one-to-one correspondence; and the at least one third color switch control signal line comprises a plurality of third color switch control signal lines, the at least one third color organic light-emitting device comprises a plurality of third color organic light-emitting devices, and the control terminals of the at least one switch element connected to the plurality of third color organic light-emitting devices are connected to the plurality of third color switch control signal lines in one-to-one correspondence.

7. The display panel according to claim 5, wherein the display panel further comprises a chromaticity adjustment device;

the chromaticity adjustment device is individually connected to each of the at least one first color switch control signal line, the at least one second color switch control signal line, and the at least one third color switch control signal line;

the chromaticity adjustment device is configured to output a first control signal to the at least one first color switch control signal line, to output a second control signal to the at least one second color switch control signal line, and to output a third control signal to the at least one third color switch control signal line, according to chrominance information of an image to be displayed in the information notification area;

the at least one first color switch control signal line adjusts switch-on time of one of the at least one switch element electrically connected to the at least one first color switch control signal line according to a duty ratio of the first control signal;

the at least one second color switch control signal line adjusts switch-on time of one of the at least one switch element electrically connected to the at least one second color switch control signal line according to a duty ratio of the second control signal; and the at least one third color switch control signal line adjusts switch-on time of one of the at least one switch element electrically connected to the at least one third color switch control signal line according to a duty ratio of the third control signal.

8. The display panel according to claim 2, wherein the display panel further comprises a brightness adjustment device;

the brightness adjustment device is connected to the at least one switch control signal line, and the brightness adjustment device is configured to output the switch control signal to the at least one switch control signal line according to brightness information of an image to be displayed in the information notification area.

9. The display panel according to claim 5, wherein the at least one first color organic light-emitting device comprises a red organic light-emitting device, the at least one second color organic light-emitting device comprises a green organic light-emitting device, and the at least one third color organic light-emitting device comprises a blue organic light-emitting device.

10. The display panel according to claim 9, wherein the second power voltage $V_R$ for causing the red organic light-emitting device to emit light satisfies $4.090V \leq V_R \leq 4.600V$;

the second power voltage $V_G$ for causing the green organic light-emitting device to emit light satisfies $3.550V \leq V_G \leq 4.600V$; and the second power voltage $V_B$ for causing the blue organic light-emitting device to emit light satisfies $3.725V \leq V_B \leq 4.600V$.

11. The display panel according to claim 2, wherein the display panel further has a first non-display area and a second non-display area;

the display area comprises a first display area and a second display area along a first direction;

the first non-display area and the second display area are sequentially arranged along a second direction, and a sum of a length of the first non-display area in the second direction and a length of the second display area in the second direction is equal to a length of the first display area in the second direction;

the second non-display area is located at a side of the second display area facing away from the first non-display area;

the display panel further comprises a driving chip arranged in the second non-display area, the pixel driving circuit is connected to the driving chip through a first signal line, and the at least one switch control signal line is connected to the driving chip through a second signal line, and the information notification area is located in the first non-display area and/or the second non-display area.

12. The display panel according to claim 11, wherein the display panel further has a third non-display area, and the third non-display area is located at a side of the first display area facing away from the second display area;

the display panel further comprises a peripheral circuit arranged in the third non-display area, the control circuit is located in the third non-display area, the control circuit does not overlap with the peripheral circuit, and the first terminal of each of the at least one switch element is connected to the anode of a respective one of the at least one second organic light-emitting device through a connection line.

13. The display panel according to claim 1, wherein the control circuit is located in the information notification area, and the at least one second organic light-emitting device overlaps with the at least one switch element, and wherein each of the at least one second organic light-emitting device has an area greater than an area of the first organic light-emitting device.

14. A display control method for a display panel, wherein the display panel has a display area and an information notification area, the display panel comprises: a first organic light-emitting device, a pixel driving circuit and at least one second organic light-emitting device, the first organic light-emitting device and the pixel driving circuit are arranged in the display area, the at least one second organic light-emitting device is arranged in the information notification area, each of the at least one second organic light-emitting device is electrically connected to a control circuit, the pixel driving circuit is different from the control circuit, the control circuit comprises at least one switch element and at least one switch control signal line which provides a switch control signal, wherein the at least one switch control signal line adjusts switch-on time of one of the at least one switch element according to a duty ratio of the switch control signal, and each of the at least one switch element has a control terminal directly connected to one of the at least one switch control signal line;

wherein the display control method comprises:

providing a first power voltage to the pixel driving circuit; and providing a second power voltage to the control circuit, wherein the second power voltage is less than the first power voltage.

15. The display control method according to claim 14, wherein each of the at least one switch element further comprises a first terminal connected to an anode of a respective one of the at least one second organic light-emitting device, and a second terminal configured to receive a third power voltage, each of the at least one second organic light-emitting device has a cathode configured to receive a fourth power voltage, and the second power voltage is formed by a voltage difference between the third power voltage and the fourth power voltage.

16. The display control method according to claim 15, wherein the at least one second organic light-emitting device comprises a plurality of second organic light-emitting devices, and the plurality of second organic light-emitting devices is electrically connected to one of the at least one switch element.

17. The display control method according to claim 16, wherein the at least one second organic light-emitting device comprises at least one first color organic light-emitting device, at least one second color organic light-emitting device and at least one third color organic light-emitting device, the at least one switch control signal line comprises at least one first color switch control signal line, at least one second color switch control signal line and at least one third color switch control signal line, the control terminal of each of the at least one switch element connected to one or more of the at least one first color organic light-emitting device is connected to one of the at least one first color switch control signal line;

the control terminal of each of the at least one switch element connected to one or more of the at least one second color organic light-emitting device is connected to one of the at least one second color switch control signal line;

the control terminal of each of the at least one switch element connected to one or more of the at least one third color organic light-emitting device is connected to one of the at least one third color switch control signal line, the at least one first color switch control signal line comprises a plurality of first color switch control signal lines, the at least one first color organic light-emitting device comprises a plurality of first color organic light-emitting devices, and the control terminals of the at least one switch element connected to the plurality of first color organic light-emitting devices are connected to the plurality of first color switch control signal lines in one-to-one correspondence;

the at least one second color switch control signal line comprises a plurality of second color switch control signal lines, the at least one second color organic light-emitting device comprises a plurality of second color organic light-emitting devices, and the respective control terminals of the at least one switch element connected to the plurality of second color organic light-emitting devices are connected to the plurality of second color switch control signal lines in one-to-one correspondence; and the at least one third color switch control signal line comprises a plurality of third color switch control signal lines, the at least one third color organic light-emitting device comprises a plurality of third color organic light-emitting devices, and the control terminals of the at least one switch element connected to the plurality of third color organic light-emitting devices are connected to the plurality of third color switch control signal lines in one-to-one correspondence.

18. The display control method according to claim 17, further comprising, after providing the second power voltage to the control circuit:

outputting a first control signal to the at least one first color switch control signal line according to chrominance information of an image to be displayed in the information notification area, and adjusting switch-on time of one of the at least one switch element connected to the at least one first color switch control signal line according to a duty ratio of the first control signal;

outputting a second control signal to the at least one second color switch control signal line according to chrominance information of an image to be displayed in the information notification area, and adjusting switch-on time of one of the at least one switch element connected to the at least one second color switch control signal line according to a duty ratio of the second control signal; and outputting a third control signal to the at least one third color switch control signal line according to chrominance information of an image to be displayed in the information notification area, and adjusting switch-on time of one of the at least one switch element connected to the at least one third color switch control signal line according to a duty ratio of the third control signal.

19. The display control method according to claim 15, further comprising, after providing the second power voltage to the control circuit:

outputting a control signal to the at least one switch control signal line according to brightness information of an image to be displayed in the information notification area, and adjusting switch-on time of one of the at least one switch element according to a duty ratio of the control signal.

20. A display device, comprising:
a display panel, wherein the display panel has a display area and an information notification area, and the display panel comprises:
a first organic light-emitting device arranged in the display area;
a pixel driving circuit arranged in the display area, wherein the pixel driving circuit is configured to receive a first power voltage; and
at least one second organic light-emitting device arranged in the information notification area, wherein each of the at least one second organic light-emitting device is electrically connected to a control circuit, and the control circuit is configured to receive a second power voltage,
wherein the second power voltage is less than the first power voltage;
wherein the pixel driving circuit is different from the control circuit; and
wherein the control circuit comprises at least one switch element and at least one switch control signal line which provides a switch control signal, wherein the at least one switch control signal line adjusts switch-on time of one of the at least one switch element according to a duty ratio of the switch control signal, and each of the at least one switch element has a control terminal directly connected to one of the at least one switch control signal line.

* * * * *